US012757743B2

(12) United States Patent
Spann et al.

(10) Patent No.: US 12,757,743 B2
(45) Date of Patent: Oct. 6, 2026

(54) PRESS PACK POWER SEMICONDUCTOR DEVICE WITH LOCATOR STRIP

(71) Applicant: Littelfuse, Inc., Chicago, IL (US)

(72) Inventors: Thomas Spann, Chicago, IL (US); Joseph Geo, Chicago, IL (US)

(73) Assignee: Littelfuse, Inc., Rosemont, IL (US)

( * ) Notice: Subject to any disclaimer, the term of this patent is extended or adjusted under 35 U.S.C. 154(b) by 362 days.

(21) Appl. No.: 18/398,608

(22) Filed: Dec. 28, 2023

(65) Prior Publication Data

US 2025/0218971 A1 Jul. 3, 2025

(51) Int. Cl.
*H10W 46/00* (2026.01)
*H10W 72/50* (2026.01)

(52) U.S. Cl.
CPC .......... *H10W 46/00* (2026.01); *H10W 72/533* (2026.01)

(58) Field of Classification Search
None
See application file for complete search history.

(56) References Cited

U.S. PATENT DOCUMENTS

| | | | |
|---|---|---|---|
| 5,633,536 | A | 5/1997 | Nakashima |
| 2013/0214404 | A1 | 8/2013 | Orimoto |
| 2017/0207211 | A1 | 7/2017 | Kuwahara |

FOREIGN PATENT DOCUMENTS

| | | | |
|---|---|---|---|
| EP | 3252809 | A1 | 12/2017 |

OTHER PUBLICATIONS

International Search Report and Written Opinion for International Application No. PCT/US2024/058194, mailed on Mar. 18, 2025, 16 pages.

*Primary Examiner* — Anthony Ho
(74) *Attorney, Agent, or Firm* — KDW Firm PLLC

(57) ABSTRACT

A press pack power semiconductor device can include a housing, a semiconductor, and a locator strip deformed into a ring-like shape to concentrically fit within the housing and concentrically locate at least part of the semiconductor therein. The locator strip can include a first plurality of regions regularly interspersed with a second plurality of regions along a length of the locator strip, and each of the first plurality of regions can have a first cross-sectional area that can be smaller than a second cross-sectional area of each of the second plurality of regions.

15 Claims, 13 Drawing Sheets

500

PRESS PACK POWER SEMICONDUCTOR DEVICE WITH LOCATOR STRIP

FIELD

The present disclosure generally relates to power semiconductor devices. More particularly, the present disclosure relates to a press pack power semiconductor device with a locator strip.

BACKGROUND

A power semiconductor device is a semiconductor device used in power electronics, and a press pack power semiconductor device is a modular housing containing the power semiconductor device, pressurized and pressed together so that electrical contacts therein maintain constant surface-to-surface connections. Known press pack power semiconductor devices include a locator strip to concentrically locate an element of the power semiconductor device within the modular housing. However, known locator strips present various challenges. For example, when the locator strip is bent or molded to fit within the modular housing, a resulting ring-like shape is non-concentric and abnormally deformed. Additionally, it is difficult to assemble and place the locator strip inside of the modular housing and the element inside of the locator strip. Indeed, such assembly involves a lot of manual bending of the locator strip, leading to potential misplacement, wrist injuries, and scratch generation. In view of the above, there is a continuing, ongoing need for improved fuse devices.

BRIEF SUMMARY

This Brief Summary is provided to introduce a selection of concepts in a simplified form that are further described below in the Detailed Description. This Brief Summary is not intended to identify key features or essential features of claimed subject matter or intended as an aid in determining scope of the claimed subject matter.

In some embodiments, a press pack power semiconductor device can include a housing, a semiconductor, and a locator strip deformed into a ring-like shape to concentrically fit within the housing and concentrically locate at least part of the semiconductor therein. The locator strip can include a first plurality of regions regularly interspersed with a second plurality of regions along a length of the locator strip, and each of the first plurality of regions can have a first cross-sectional area that can be smaller than a second cross-sectional area of each of the second plurality of regions.

In some embodiments, each of the first plurality of regions can include a trench on a first side of the locator strip.

In some embodiments, each of the first plurality of regions can include a trench on a second side of the locator strip, and the second side of the locator strip can opposite the first side of the locator strip.

In some embodiments, the trench on the second side of the locator strip can be directly opposite the trench on the first side of the locator strip.

In some embodiments, the trench on the second side of the locator strip can be offset from the trench on the first side of the locator strip.

In some embodiments, the trench can be U-shaped.

In some embodiments, the trench can be V-shaped.

In some embodiments, the trench can be curved.

In some embodiments, each of the first plurality of regions can be weaker than each of the second plurality of regions.

In some embodiments, a locator strip can include a polymer sheet that can include a first plurality of regions regularly interspersed with a second plurality of regions along a length of the polymer sheet. Each of the first plurality of regions can have a first cross-sectional area that can be smaller than a second cross-sectional area of each of the second plurality of regions, and the polymer sheet can be deformable into a ring-like shape to concentrically fit within a housing of a press pack power semiconductor device and concentrically locate a semiconductor therein.

In some embodiments, each of the first plurality of regions can include a trench on a first side of the polymer sheet.

In some embodiments, each of the first plurality of regions can include a trench on a second side of the polymer sheet, and the second side of the polymer sheet can be opposite the first side of the locator polymer sheet.

In some embodiments, the trench on the second side of the polymer sheet can be directly opposite the trench on the first side of the polymer sheet.

In some embodiments, the trench on the second side of the polymer sheet can be offset from the trench on the first side of the polymer sheet.

In some embodiments, the trench can be U-shaped.

In some embodiments, the trench can be V-shaped.

In some embodiments, the trench can be curved.

In some embodiments, each of the first plurality of regions can be weaker than each of the second plurality of regions.

In some embodiments, a method can include deforming a locator strip into a ring-like shape, concentrically fitting the ring-like shape of the locator strip within a housing, and concentrically locating a semiconductor within the ring-like shape of the locator strip. The locator strip can include a first plurality of regions regularly interspersed with a second plurality of regions along a length of the locator strip, and each of the first plurality of regions can have a first cross-sectional area that can be smaller than a second cross-sectional area of each of the second plurality of regions.

In some embodiments, the method can include weakening the first plurality of regions relative to the second plurality of regions with a trench on a first side of the locator strip or a second side of the locator strip that can reduce the first-cross sectional area relative to the second cross-sectional area.

Other technical features may be readily apparent to one skilled in the art from the following figures, descriptions, and claims.

DETAILED DESCRIPTION

Figure 1A:
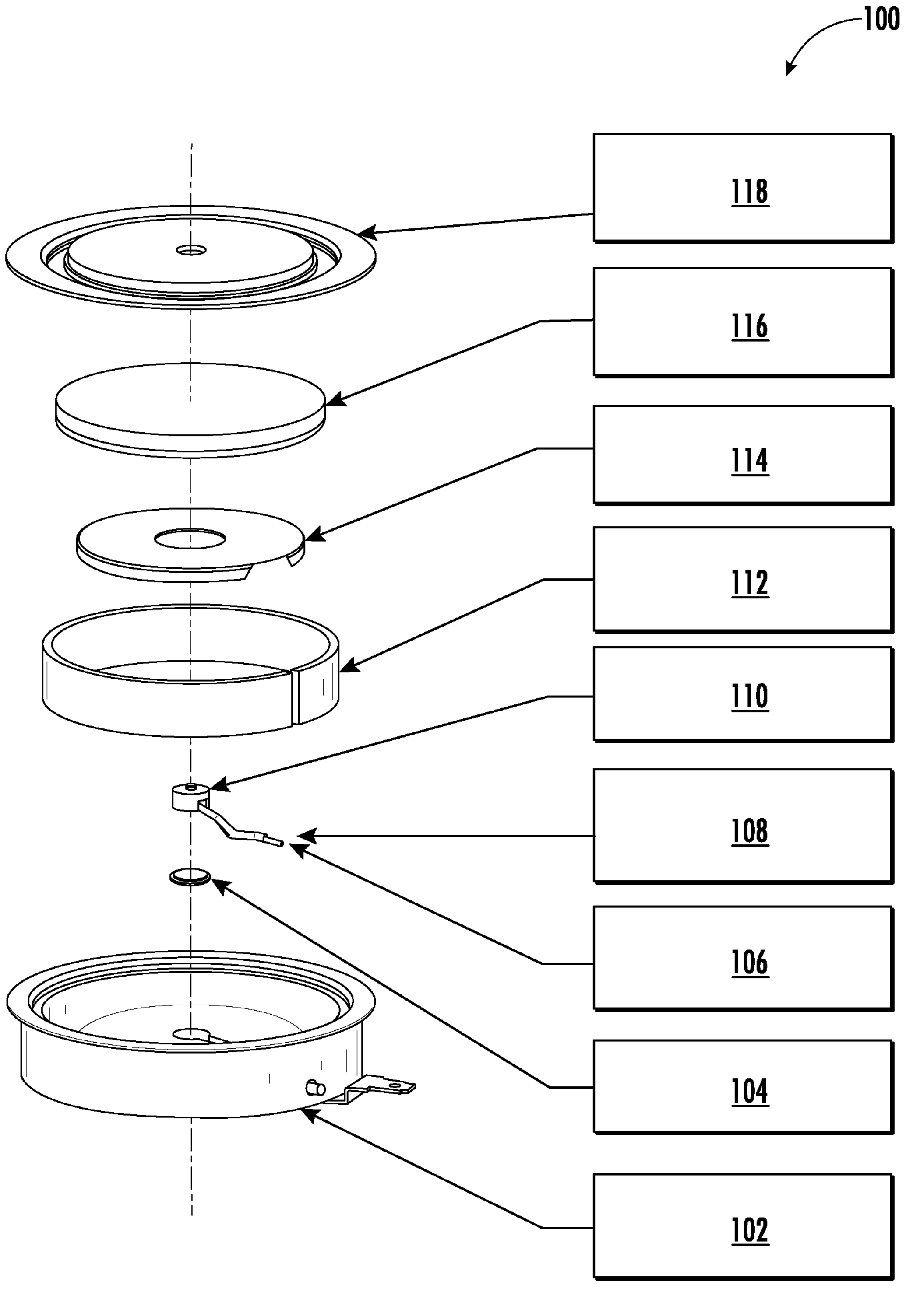
FIG. 1A PRIOR ART
FIG. 1A is an exploded view illustrating a press pack power semiconductor device with a locator strip known in the art.

Exemplary embodiments of a press pack power semiconductor device with a locator strip in accordance with the present disclosure will now be described more fully hereinafter with reference made to the accompanying drawings. The press pack power semiconductor device with the locator strip may, however, be embodied in many different forms and should not be construed as being limited to the embodiments set forth herein. Rather, these embodiments are provided so that this disclosure will convey certain exemplary aspects of the press pack power semiconductor device with the locator strip to those skilled in the art.

In accordance with disclosed embodiments, a press pack power semiconductor device can include a housing, a semiconductor, and a locator strip that can be deformed into a ring-like shape to concentrically fit within the housing and concentrically locate at least part of the semiconductor therein. In some embodiments, the locator strip can include a first plurality of regions regularly interspersed with a second plurality of regions along a length of the locator strip, and in some embodiments, each of the first plurality of regions can have a first cross-sectional area that can be smaller than a second cross sectional area of each of the second plurality of regions. As such, in some embodiments, each of the first plurality of regions can be weaker than each of the second plurality of regions so as to aid in deformation of the locator ring as disclosed and described herein.

For example, in some embodiments, each of the first plurality of regions can include a trench on a first side of the locator strip. Additionally or alternatively, in some embodiments, each of the first plurality of regions can include a trench on a second side of the locator strip such that the second side of the locator strip can be opposite the first side of the locator strip. When both the first side of the locator strip and the second side of the locator strip include trenches, the trench on the second side of the locator strip can be directly opposite the trench on the first side of the locator strip. Alternatively, when both the first side of the locator strip and the second side of the locator strip include trenches, the trench on the second side of the locator strip can be offset from the trench on the first side of the locator strip. In any embodiment, the trenches can be U-shaped, V-shaped, curved, and the like.

In accordance with disclosed embodiments, the locator strip itself can include a polymer sheet that can include the first plurality of regions regularly interspersed with the second plurality of regions along a length of the polymer sheet. In some embodiments, each of the first plurality of regions can have the first cross-sectional area that can be smaller than the second cross-sectional area of each of the second plurality of regions, and in some embodiments, the polymer sheet can be deformable into the ring-like shape to concentrically fit within the housing of the press pack power semiconductor device and concentrically locate the semiconductor therein. In this regard, in some embodiments, each of the first plurality of regions can be weaker than each of the second plurality of regions so as to enable deformation of the polymer sheet as disclosed and described herein.

For example, in some embodiments, each of the first plurality of regions can include the trench on a first side of the polymer sheet. Additionally or alternatively, in some embodiments, each of the first plurality of regions can include the trench on a second side of the polymer sheet such that the second side of the polymer sheet can be opposite the first side of the polymer sheet. When both the first side of the polymer sheet and the second side of the polymer sheet include trenches, the trench on the second side of the polymer sheet can be directly opposite the trench on the first side of the polymer sheet. Alternatively, when both the first side of the polymer sheet and the second side of the polymer sheet include trenches, the trench on the second side of the polymer sheet can be offset from the trench on the first side of the polymer sheet. In any embodiment, the trenches can be U-shaped, V-shaped, curved, and the like.

In accordance with disclosed embodiments, a method can include deforming the locator strip into the ring-like shape, concentrically fitting the ring-like shape of the locator strip within the housing, and concentrically locating the semiconductor within the ring-like shape of the locator strip. In some embodiments, the locator strip can include the first plurality of regions regularly interspersed with the second plurality of regions along the length of the locator strip, and in some embodiments, each of the first plurality of regions can have the first cross-sectional area that can be smaller than the second cross-sectional area of each of the second plurality of regions. In this regard, in some embodiments, the method can also include weakening the first plurality of regions relative to the second plurality of regions with the trench on the first side of the locator strip or the second side of the locator strip to reduce the first cross-sectional area relative to the second cross-sectional area.

In some embodiments, the locator strip as disclosed and described herein can include a polymer, and in some embodiments, the polymer can include polytetrafluoroethylene (PTFE). As known by those of ordinary still in the art, PTFE is a highly robust material having a capability to withstand extreme temperatures and is resistant to almost all industrial chemicals. However, these properties also create challenges when trying to bend or mold a sheet of PTFE into a concentric shape because the PTFE may not be pliable enough to bend or mold into a desired shape without outside assistance, such as use of a PVC pipe or a 3D printed tool.

Advantageously, the first plurality of regions of the locator strip having reduced cross-sectional areas relative to the second plurality of regions can allow for increased flexibility and elasticity, and thus, easier elastic and plastic deformation of the locator strip relative to one having a consistent cross-sectional area, thereby mitigating previously known challenges when bending or molding the locator strip into the ring-like shape. Indeed, the reduced cross-sectional areas can make the first plurality of regions weaker than the second plurality of regions, which can allow or enable the ring-like shape created when deforming the locator strip to be truly concentric with the housing of the press pack power semiconductor device when placed therein and with the semiconductor when the semiconductor is placed within the ring-like shape, without portions of the ring-like shape of the locator strip deformed into a non-concentric shape. Such concentricity can be achieved due to case of assembly, thereby mitigating repetitive strain injuries and improving quality, productivity, and yield during manufacture.

Figure 1B:
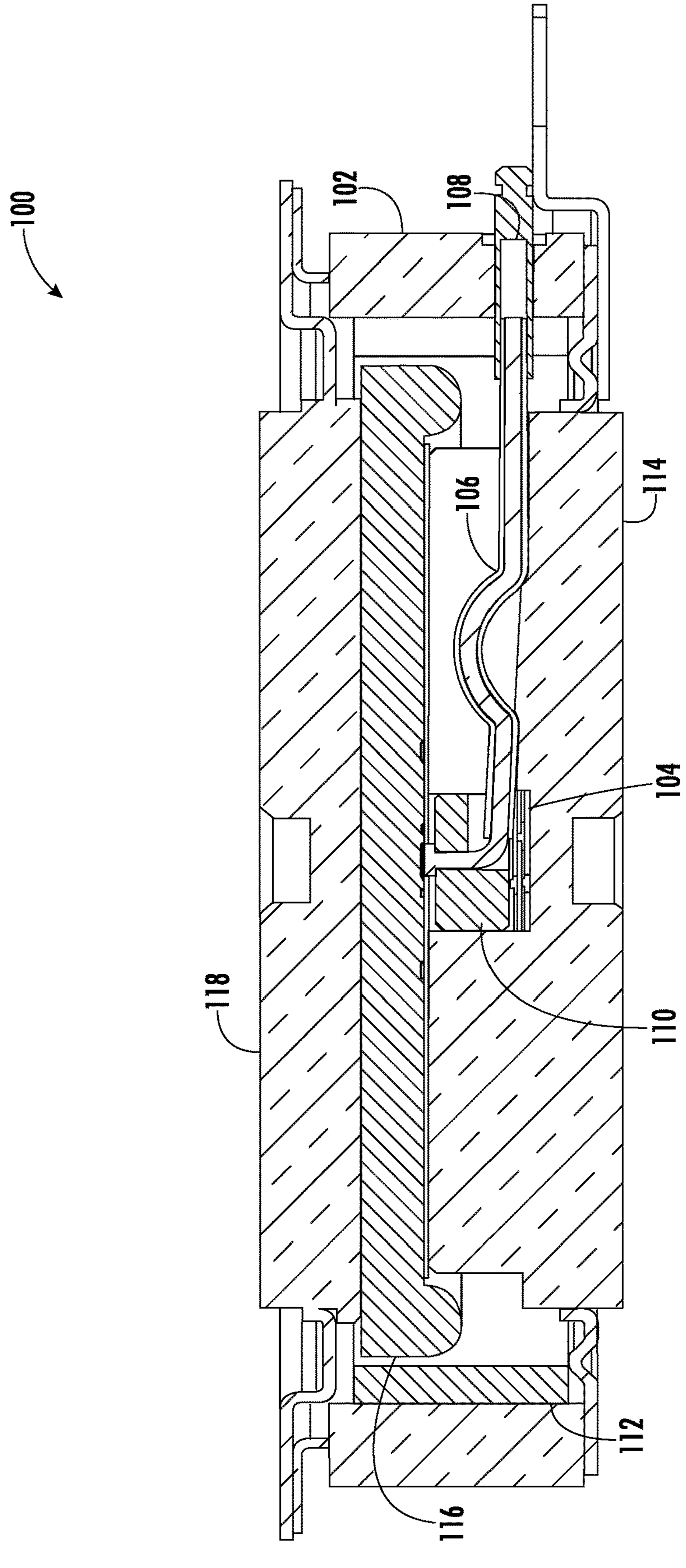
FIG. 1B PRIOR ART
FIG. 1B is cross-sectional view illustrating a press pack power semiconductor device with a locator strip known in the art.
Figure 2A:
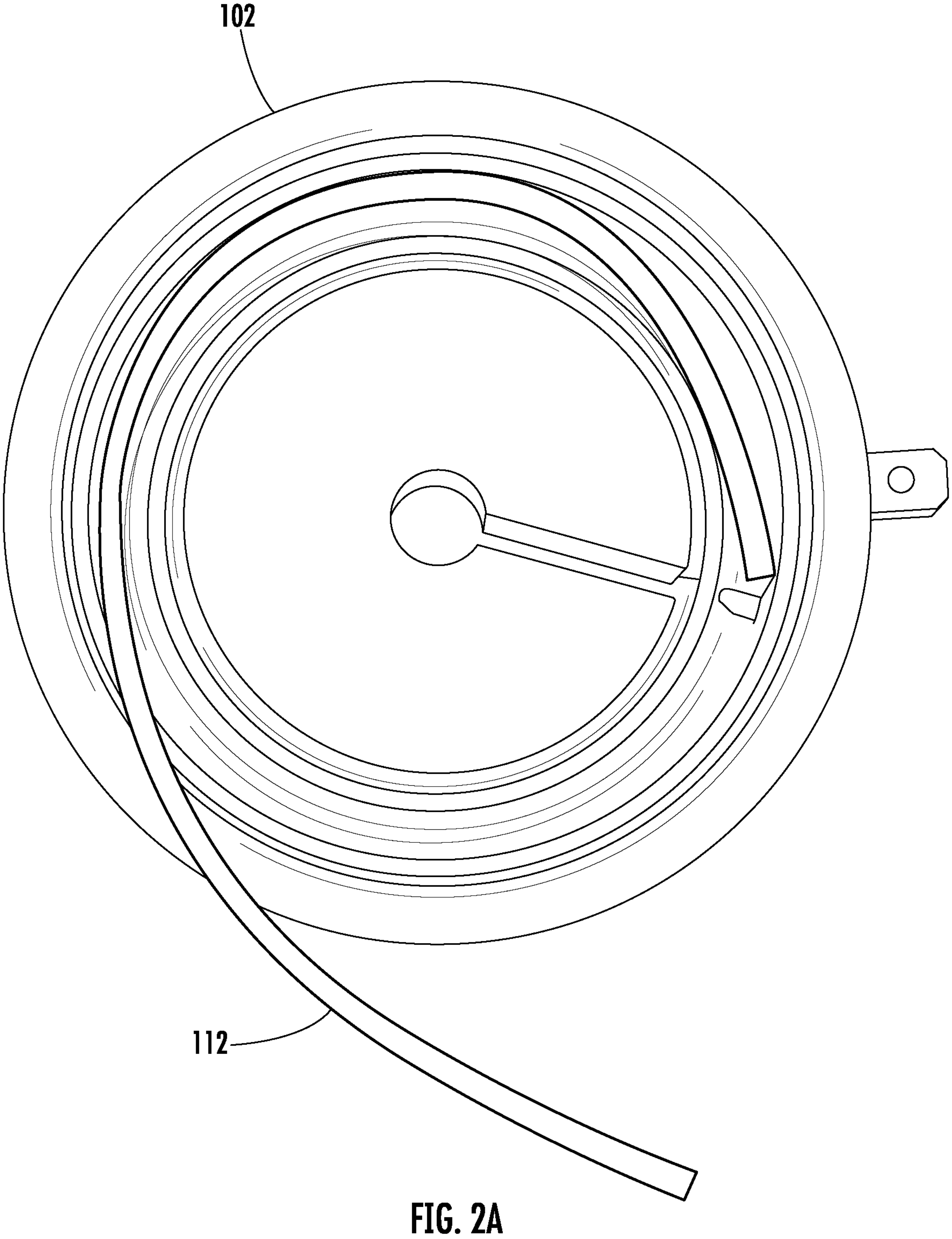
FIG. 2A PRIOR ART
FIG. 2A is a top view illustrating a press pack power semiconductor device with a locator strip known in the art.
Figure 2B:
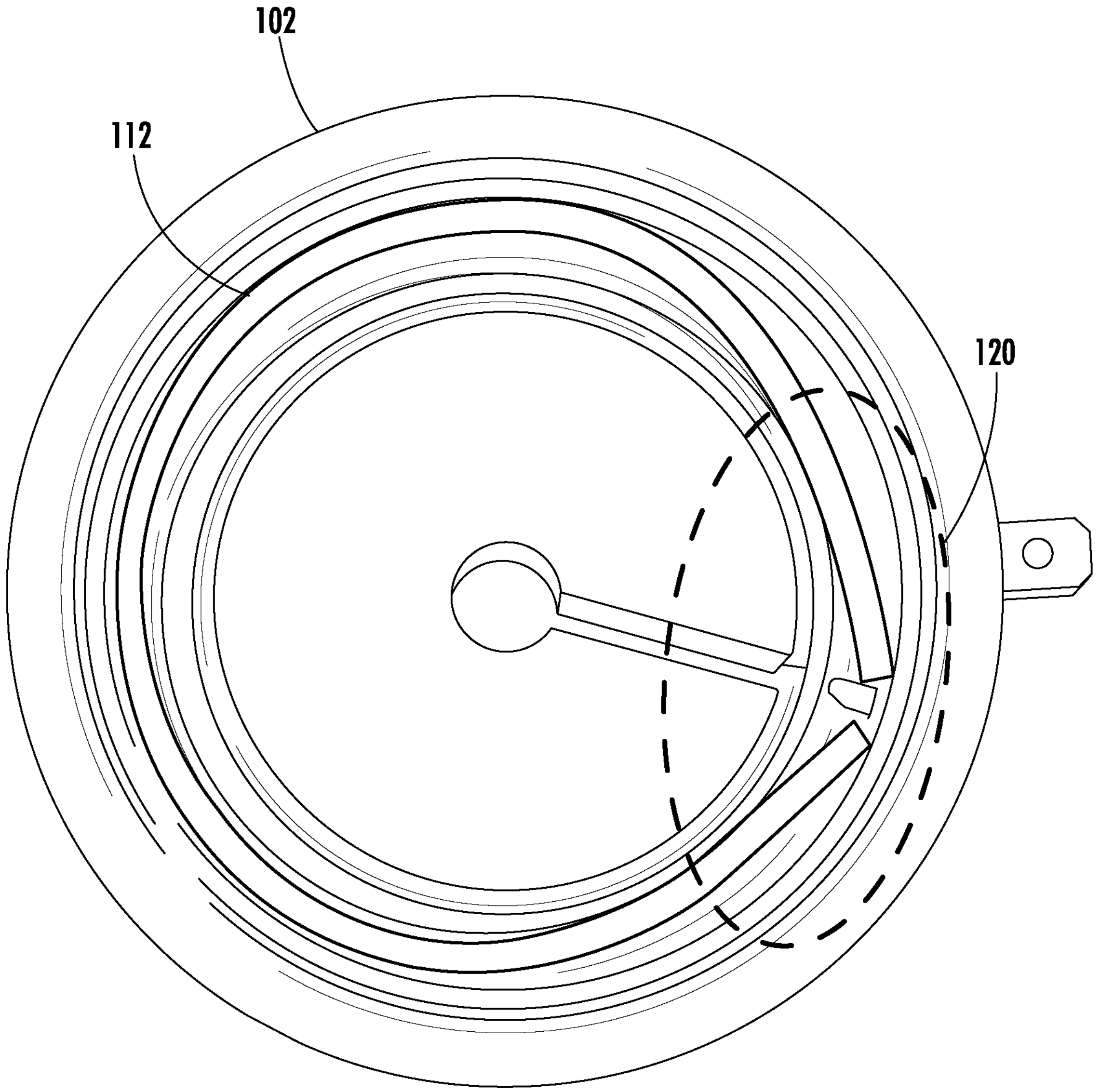
FIG. 2B PRIOR ART
FIG. 2B is a top view illustrating a press pack power semiconductor device with a locator strip known in the art.
Figure 2C:
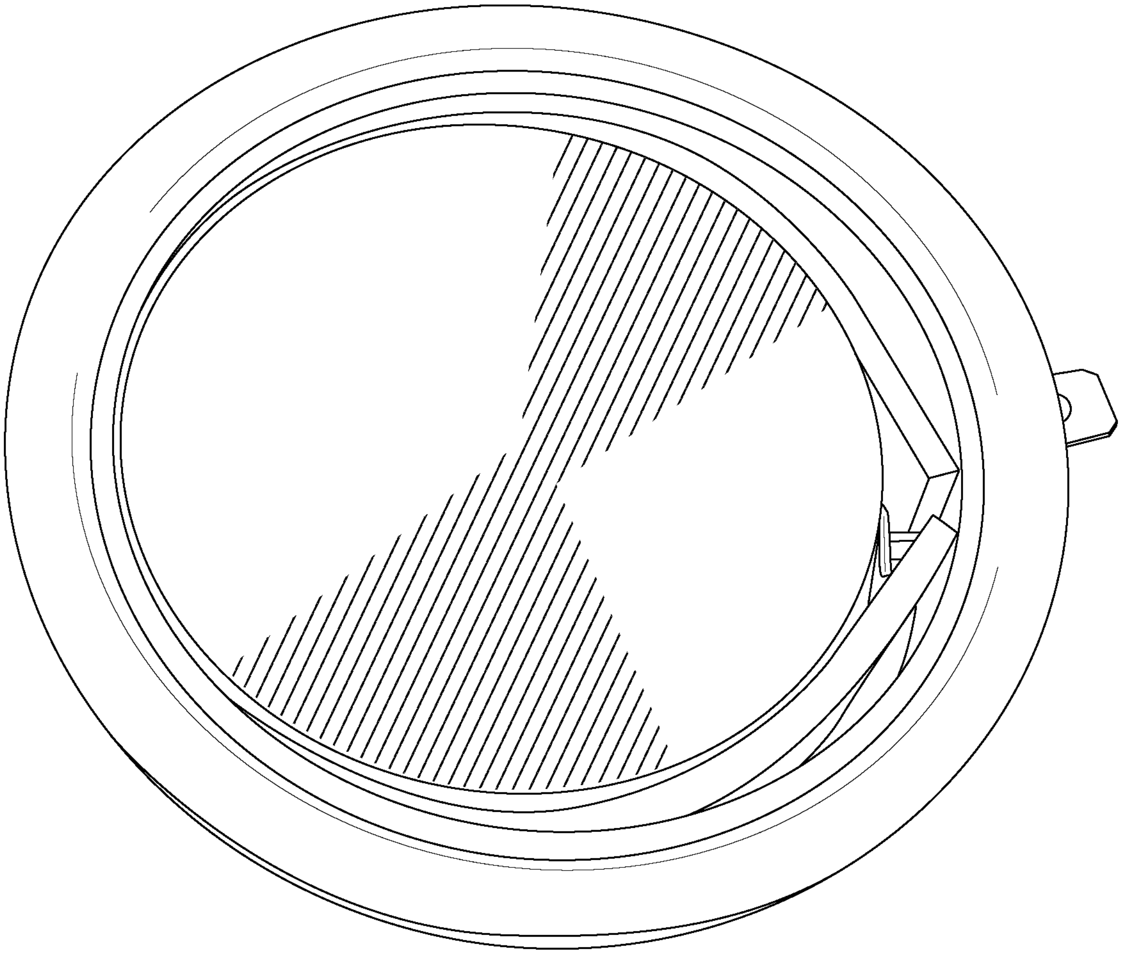
FIG. 2C PRIOR ART
FIG. 2C is a top view illustrating a press pack power semiconductor device with a locator strip known in the art.

FIG. 1A is an exploded view illustrating a press pack power semiconductor device 100 known in the art, FIG. 1B is a cross-sectional view illustrating the press pack power semiconductor device 100, and FIG. 2A, FIG. 2B, and FIG. 2C are top views illustrating the press pack power semiconductor device 100 with a locator strip 112. As seen in FIG. 1A and FIG. 1B, the press pack power semiconductor device 100 can include a housing that includes a modular body 102 and a lid 118. A spring 104 and a gate wire 108 can be disposed within the modular body 102 with an insulator 110 disposed at a first end of the gate wire 108, a second end of the gate wire 108 located in a gate tube within the modular body 102, and a sleeve 106 disposed around the gate wire 108 along a length thereof.

The locator strip 112 can be located along an interior circumference of the modular body 102 with a moly cap 114 and a semiconductor die 116 located within a circumference of the locator strip 112. The lid 118 can be located on top of the modular body 102 to hermetically seal all other elements therein.

As seen in FIG. 2A, FIG. 2B, and FIG. 2C, the locator strip 112 can include a polymer sheet with a consistent cross-sectional area along a length thereof, and the locator strip 112 can be bent to fit within the modular body 102 and locate the semiconductor die 116 therein.

However, when made from PTFE, the locator strip 112 can be difficult to bend, thereby resulting in the locator strip 112 being abnormally deformed into a ring-like shape that is non-concentric with the modular body 102, most notably within region 120.

As such, when the locator strip 112 is used to locate the semiconductor die 116 therein, the semiconductor die 116 may not be centered, which may result in surface-to-surface connections between electrical contacts of the semiconductor die 116 and the gate wire 108 being inconsistent or nonexistent.

Figure 3A:
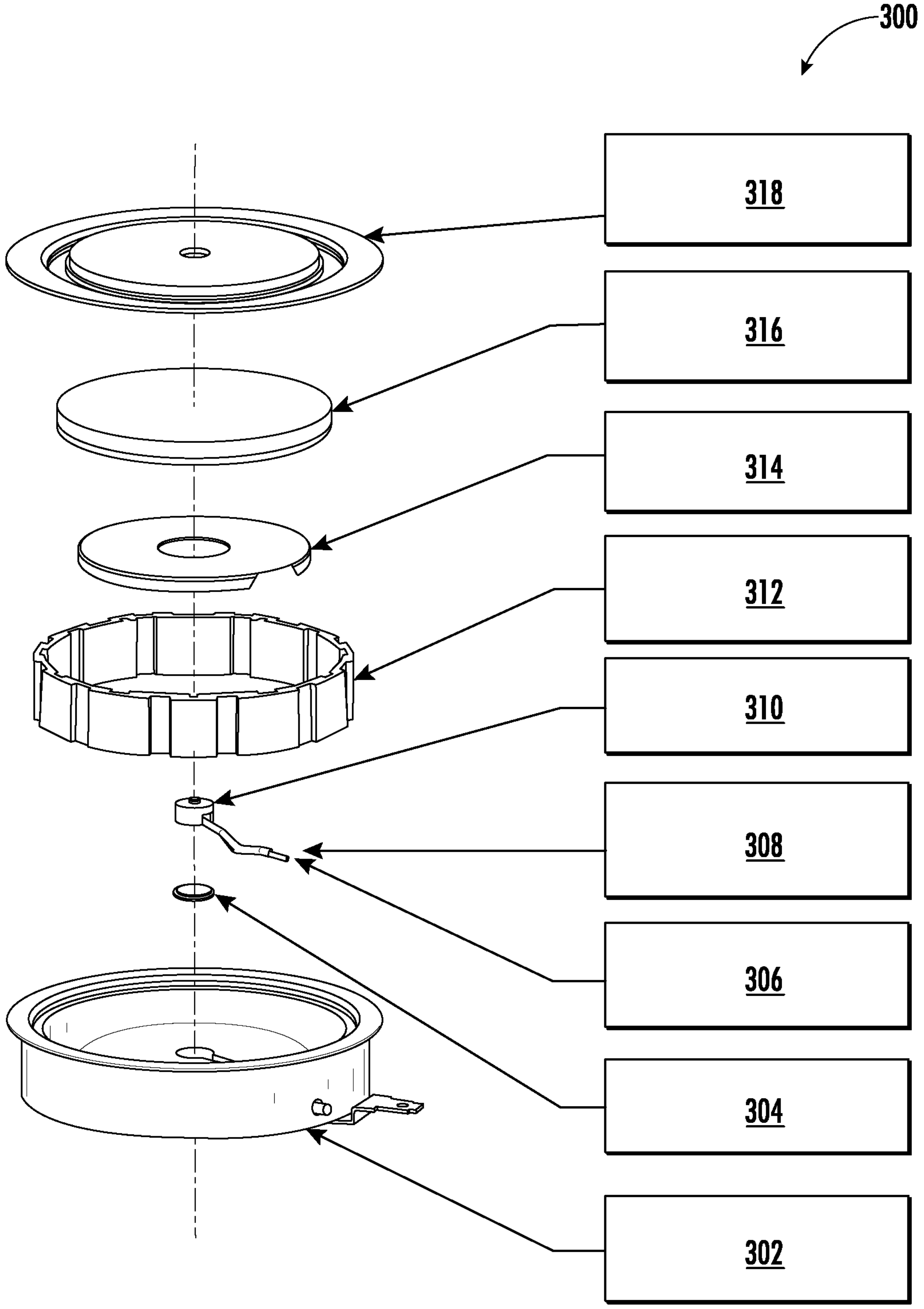
FIG. 3A is an exploded view illustrating a press pack power semiconductor device with a locator strip in accordance with disclosed embodiments.
Figure 3B:
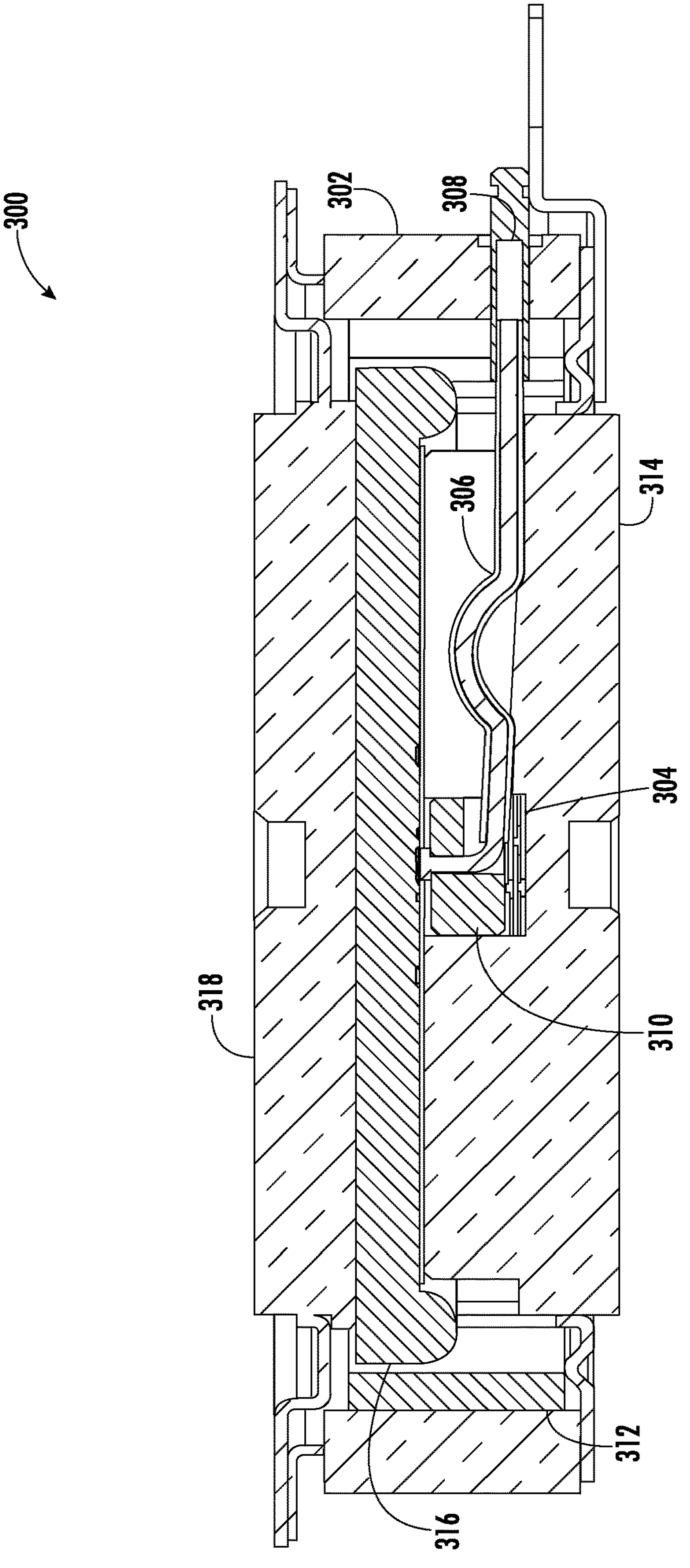
FIG. 3B is cross-sectional view illustrating a press pack power semiconductor device with a locator strip in accordance with disclosed embodiments.
Figure 4:
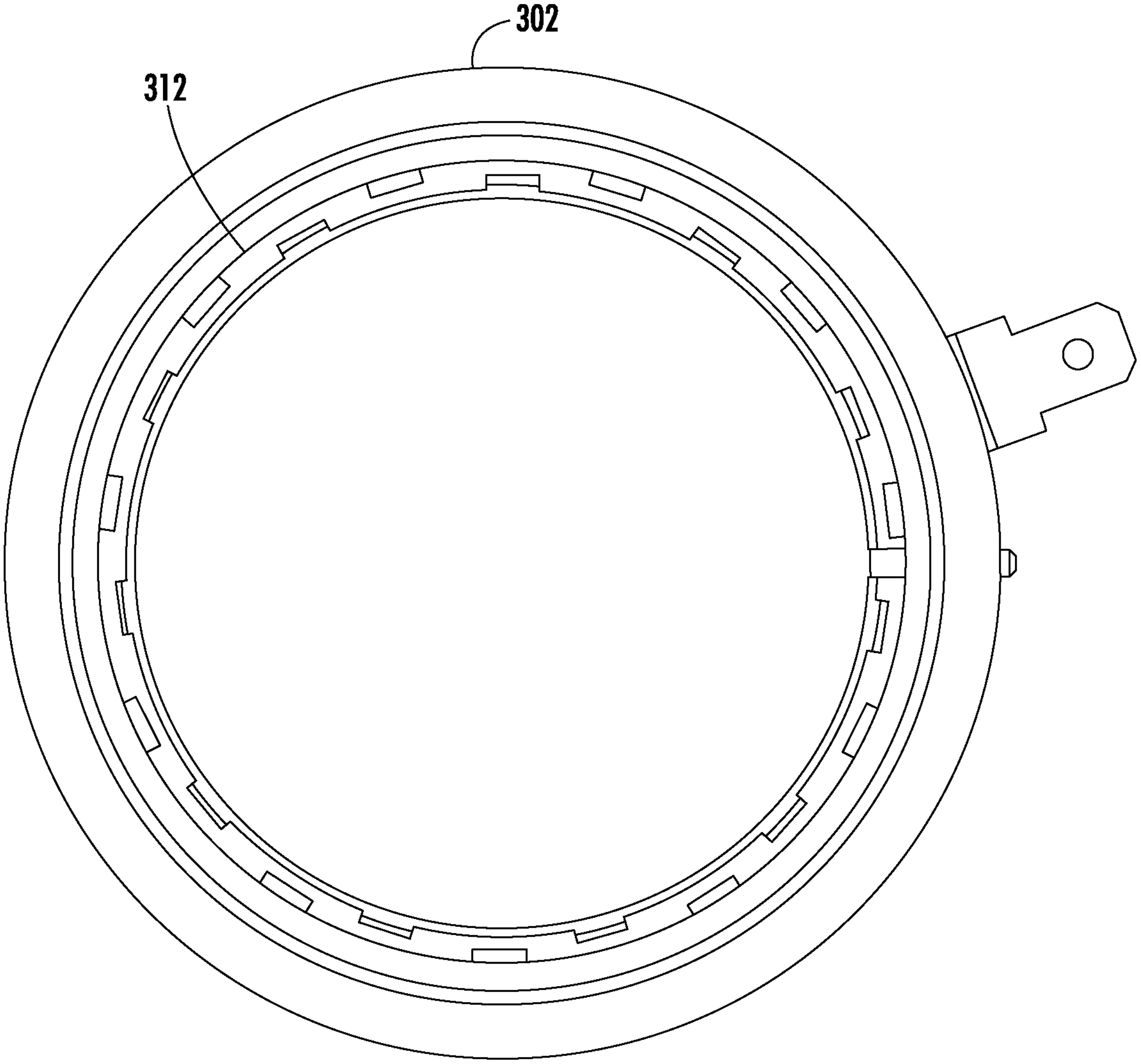
FIG. 4 is a top view illustrating a modular body and a locator strip of a press pack power semiconductor device in accordance with disclosed embodiments.

FIG. 3A is an exploded view illustrating a press pack power semiconductor device 300 in accordance with disclosed embodiments, FIG. 3B is a cross-sectional view illustrating the press pack power semiconductor device 300, and FIG. 4 is a top view illustrating a modular body 302 and a locator strip 312 of the press pack power semiconductor device 300. As seen in FIG. 3A, the press pack power semiconductor device 300 can include a housing that includes the modular body 302 and a lid 318. A spring 304 and a gate wire 308 can be disposed within the modular body 302 with an insulator 310 disposed at a first end of the gate wire 308, a second end of the gate wire 308 located in a gate tube within the modular body 302, and a sleeve 306 disposed around the gate wire 308 along a length thereof. The press pack power semiconductor device 300 can experience a range of temperatures, causing expansion and contraction of elements therein, and the spring 304 can provide flexibility for movement of the gate wire 308 during such expansion and contraction.

In some embodiments, the insulator 310 can include ceramic. Additionally or alternatively, in some embodiments, the sleeve 306 can include a polymer, including PTFE, to protect the gate wire 308.

The locator strip 312 can be located along an interior circumference of the modular body 302 with a moly cap 314 and a semiconductor die 316 located within a circumference of the locator strip 312. The lid 318 can be located on top of the modular body 302 to hermetically seal all other elements therein, creating pressure contacts, including between copper electrodes and other metal parts of the press pack power semiconductor device 300.

In accordance with disclosed embodiments, the locator strip 312 can include a polymer sheet with inconsistent cross-sectional areas along a length thereof. For example, in some embodiments, the polymer sheet can include regular positions along the length thereof with reduced cross-sectional areas, and in some embodiments, the reduced cross-sectional areas can be weaker than other (unreduced) cross-sectional areas of the locator strip 312 so as to facilitate pliability, including flexibility, elasticity, and elastic and plastic deformation of the locator strip 312.

As such and as best seen in FIG. 4, when the locator strip 312 is bent to fit within the modular body 302, the locator strip 312 can be deformed into a ring-like shape that is concentric with the modular body 302. In this regard, there can be an equal gap between the locator strip 312 and the modular body 302 along the length of the locator strip 312. Further, when the ring-like shape of the locator strip 312 is located along the interior circumference of the modular body 302, the locator strip 312 can concentrically locate the semiconductor die 316 therein so that the semiconductor die 316 is centered, thereby achieving constant surface-to-surface connections at least between electrical (metal) contacts of the semiconductor die 316 and the gate wire 308. In this regard, there can be an equal gap between the locator strip 312 and the semiconductor die 316 along the length of the locator strip 312.

It is to be understood that while FIG. 4 illustrates a top view of the modular body, a side view of the locator strip 312 is illustrated as the side of the locator strip 312 is viewable when the locator strip 312 is concentrically located within the modular body 302. It is also to be understood that the ring-like shape of the locator strip 312 can be open, that is, an incomplete ring. In particular, an opening between ends of the locator strip 312 of the ring-like shape can be spaced apart to allow the gate wire 308 to be located in the gate tube within the modular body 302.

Various embodiments of the locator strip 312 are contemplated and disclosed and described herein. In this regard, FIGS. 5A-5M are side views illustrating different embodiments of a locator strip 500 prior to being deformed into the ring-like shape. It is to be understood that the locator strip 312 can include any embodiment of the locator strip 500 as disclosed and described herein as well as those not specifically disclosed and described herein, but that come within the spirit and scope of described embodiments.

Figure 5A:
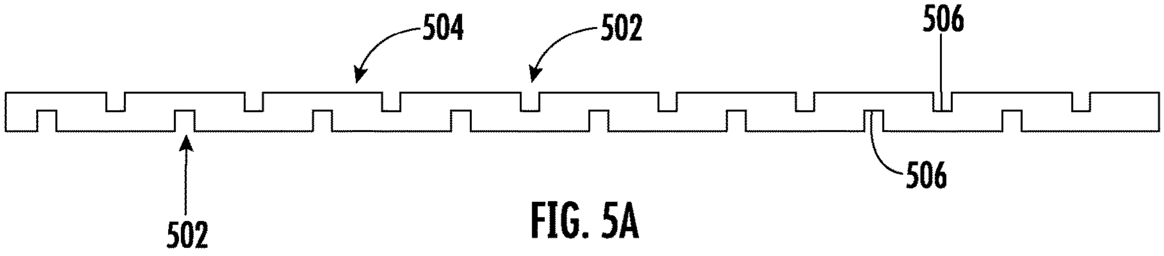
FIG. 5A is a side view illustrating a locator strip in accordance with disclosed embodiments.
Figure 5B:
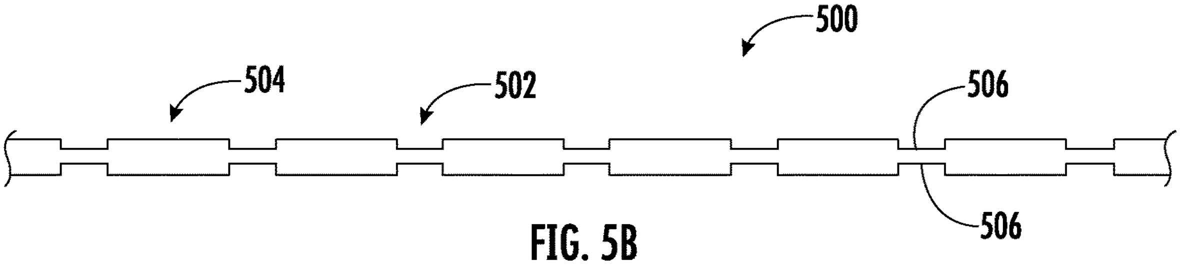
FIG. 5B is a side view illustrating a locator strip in accordance with disclosed embodiments.
Figure 5C:
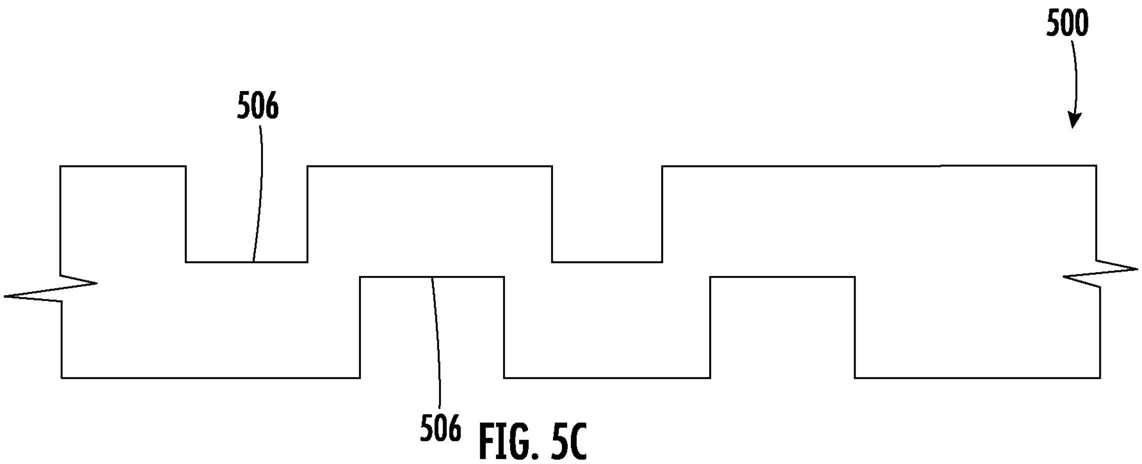
FIG. 5C is a side view illustrating a locator strip in accordance with disclosed embodiments.

For example, as best seen in FIGS. 5A-5B, in some embodiments, the locator strip 500 can include a first plurality of regions 502 regularly interspersed with a second plurality of regions 504 along a length of the locator strip 500. In some embodiments, each of the first plurality of regions 502 can have a first cross-sectional area, each of the second plurality of regions 504 can have a second cross-sectional area, and the first cross-sectional area can be smaller than the second cross-sectional area.

In some embodiments, to facilitate the first cross-sectional area being reduced relative to the second cross-sectional area, each of first plurality of regions 502 can include a trench 506 on a first side of the locator strip 500. For example, as best seen in FIGS. 5I-5M, the locator strip 500 can include trenches 506 regularly interspersed along the length of one side of the locator strip 500.

However, in some embodiments, to facilitate the first cross-sectional area being reduced relative to the second cross-sectional area, some of the first plurality of regions 502 can include the trench 506 on the first side of the locator strip 500 and some (or others) of the first plurality of regions 502 can include the trench 506 on a second side of the locator strip 500 opposite the first side of the locator strip. For example, as best seen in FIGS. 5A-5G, the locator strip 500 can include trenches 506 regularly interspersed along the length of both sides of the locator strip 500.

As best seen in FIG. 5B, in some embodiments, the trench 506 on the second side of the locator strip 500 can be directly opposite the trench 506 on the first side of the locator strip 500. In this regard, the trench 506 on the first side of the locator strip 500 and the trench 506 of the second side of the locator strip 500 can be in a same one of the first plurality of regions 502 of the locator strip 500. However, as best seen in FIG. 5A, in some embodiments, the trench 506 on the second side of the locator strip 500 can be offset from and/or alternate with the trench 506 on the first side of the locator strip 500. In this regard, the trench 506 on the first side of the locator strip 500 can be in a first one of the first plurality of regions 502 of the locator strip 500, and the trench 506 on the second side of the locator strip 500 can be in a second one of the first plurality of regions 502 of the locator strip 500. The second one of the first plurality of regions 502 of the locator strip 500 can be adjacent to the first one of the first plurality of regions 502 or separated from the first one of the first plurality of regions 502 of the locator strip 500 by one of the second plurality of regions 504 of the locator strip 500.

Figure 5D:
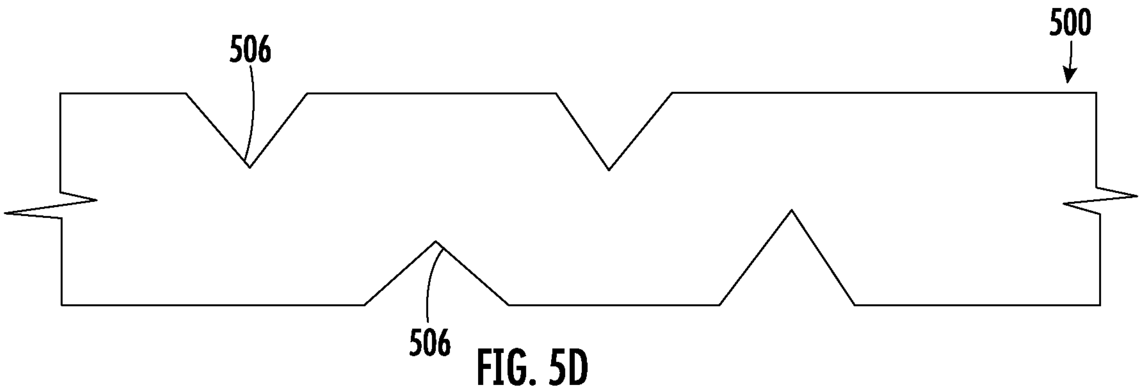
FIG. 5D is a side view illustrating a locator strip in accordance with disclosed embodiments.
Figure 5E:
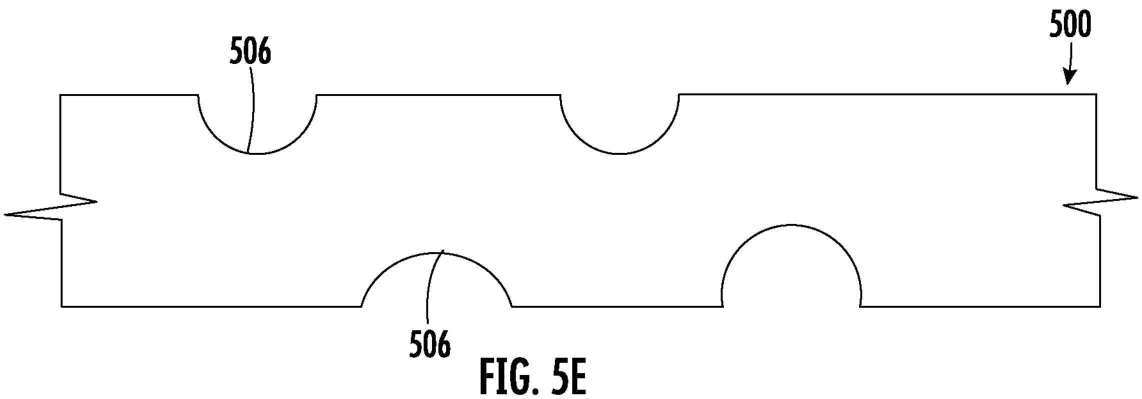
FIG. 5E is a side view illustrating a locator strip in accordance with disclosed embodiments.
Figure 5F:
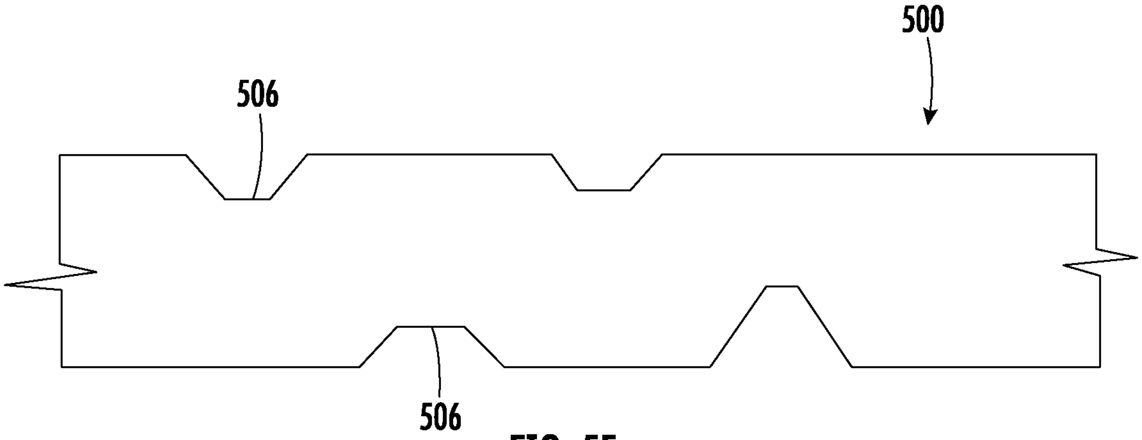
FIG. 5F is a side view illustrating a locator strip in accordance with disclosed embodiments.
Figure 5G:
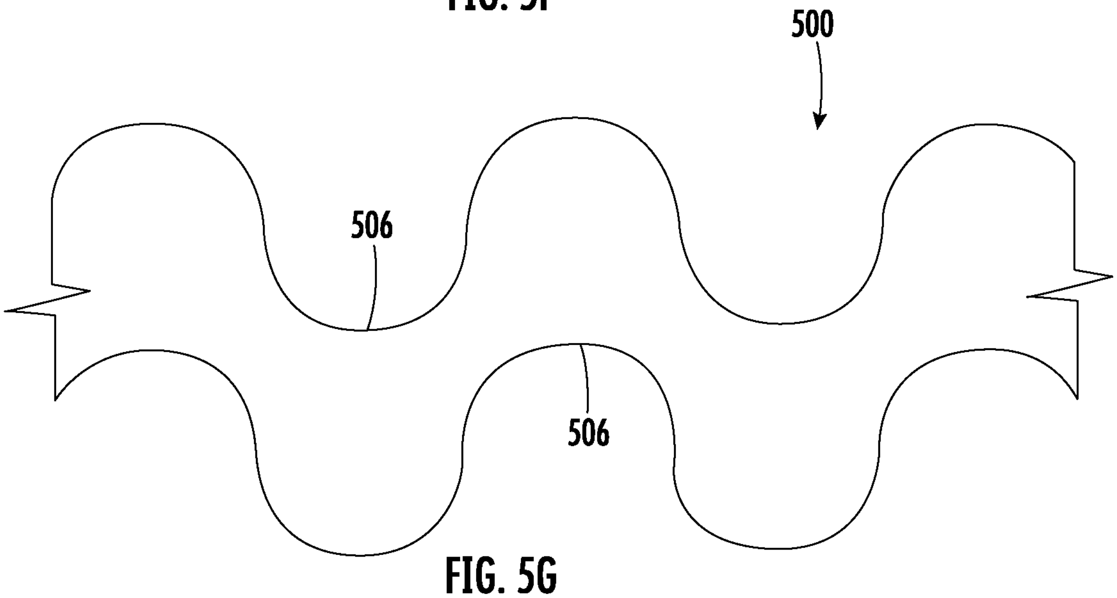
FIG. 5G is a side view illustrating a locator strip in accordance with disclosed embodiments.
Figure 5H:
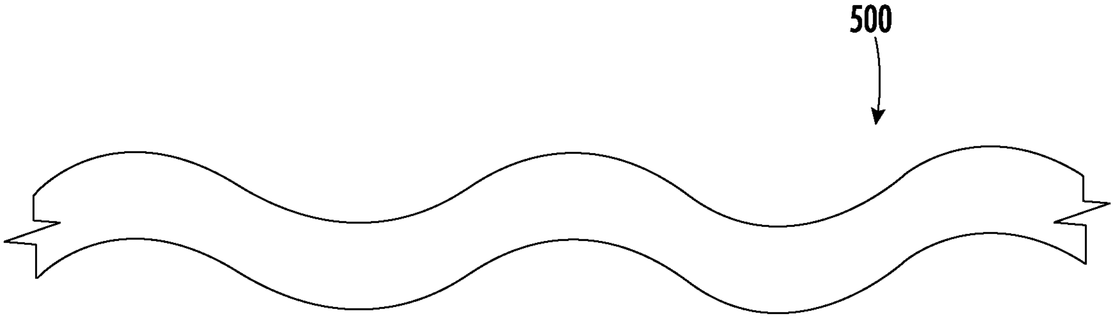
FIG. 5H is a side view illustrating a locator strip in accordance with disclosed embodiments.
Figure 5L:
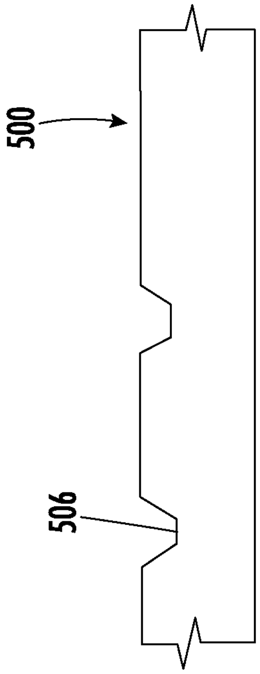
FIG. 5L is a side view illustrating a locator strip in accordance with disclosed embodiments.
Figure 5M:
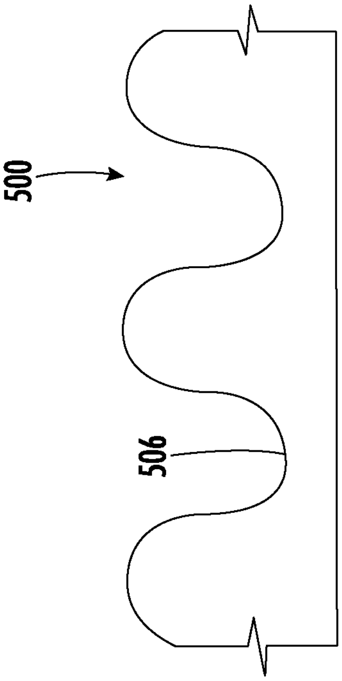
FIG. 5M is a side view illustrating a locator strip in accordance with disclosed embodiments.
Figure 5I:
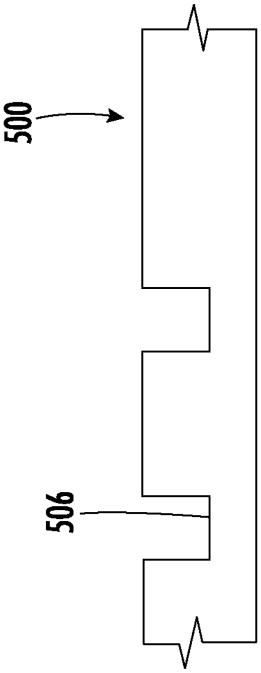
FIG. 5I is a side view illustrating a locator strip in accordance with disclosed embodiments.
Figure 5J:
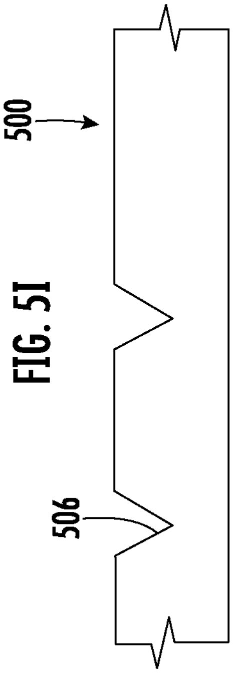
FIG. 5J is a side view illustrating a locator strip in accordance with disclosed embodiments.
Figure 5K:
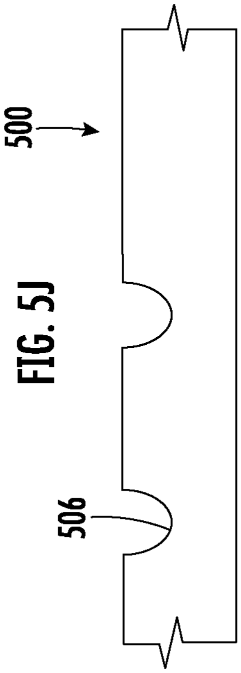
FIG. 5K is a side view illustrating a locator strip in accordance with disclosed embodiments.

In some embodiments, the trenches 506 can be U-shaped, V-shaped, curved, and/or different combinations thereof. For example, the trenches 506 illustrated in FIGS. 5A-5C and FIG. 5I are U-shaped, and the trenches 506 illustrated in FIG. 5D and FIG. 5J are V-shaped. Similarly, the trenches 506 illustrated in FIG. 5E, FIGS. 5G-5H, FIG. 5K, and FIG. 5M are curved, and the trenches 506 illustrated in FIG. 5F and FIG. 5L are some combination of U-shaped and V-shaped. In this regard, a shape of any one of the trenches 506 can be a combination of shapes and/or different ones of the trenches 506 on the locator strip 500 can be different shapes.

Figure 6:
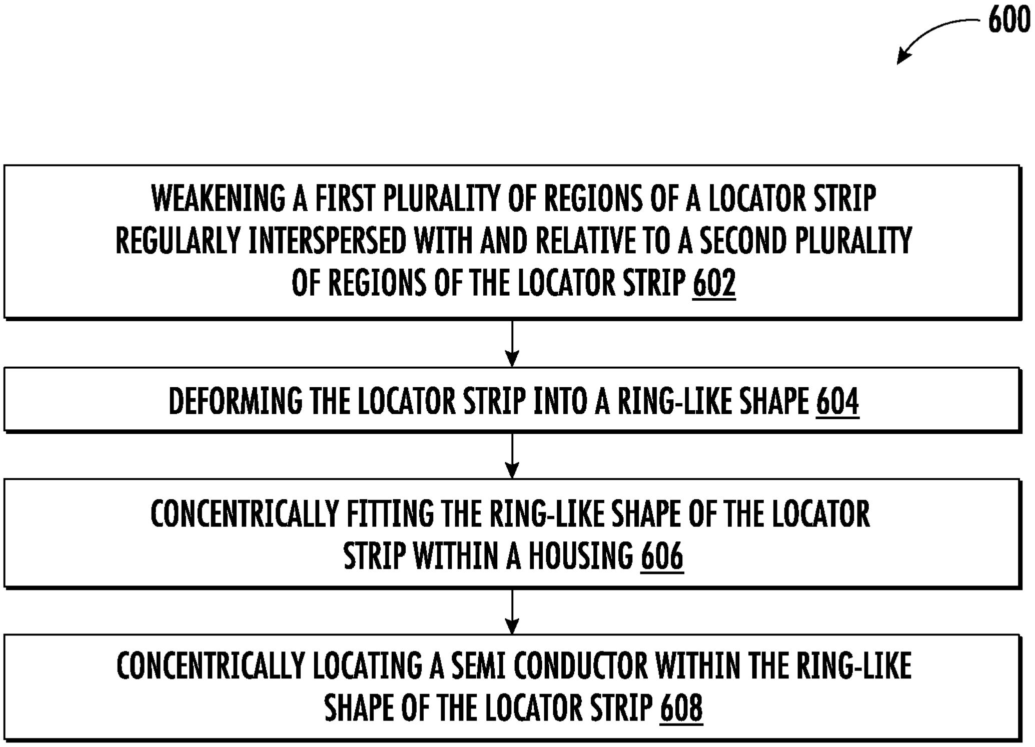
FIG. 6 is a flow chart illustrating a method 600 in accordance with disclosed embodiments.

FIG. 6 is a flow chart illustrating a method 600 in accordance with disclosed embodiments. As seen, the method 600 can include weakening a first plurality of regions of a locator strip regularly interspersed with and relative to a second plurality of regions of the locator strip as in 602. For example, to weaken the first plurality of regions in some embodiments, each of the first plurality of regions can include a first cross-sectional area that can be smaller than a second cross-sectional area of each of the second plurality of regions. Additionally or alternatively, to weaken the first plurality of regions in some embodiments, each of the first plurality of regions can include a trench on a first side of the locator strip and/or a second side of the locator strip that can reduce the first cross-sectional area relative to the second cross-sectional area.

The method 600 can also include deforming the locator strip into a ring-like shape concentric with a housing as in 604. For example, when the first plurality of regions of the locator strip are weakened as described above, the locator strip can be pliable enough to bend the locator strip into the ring-like shape. Then, the method 600 can include concentrically fitting the ring-like shape of the locator strip within the housing as in 606. Finally, the method 600 can include concentrically locating at least part of a semiconductor, such as a semiconductor die, within the ring-like shape of the locator strip as in 608. In this regard, the semiconductor can be centered within the ring-like shape of the locator strip.

As used herein, an element or a step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations, and changes to the described embodiments are possible without departing from the sphere and scope of the present disclosure, as defined in the appended claims. Accordingly, it is intended that the present disclosure not be limited to the described embodiments, but that it has the full scope defined by the language of the following claims and equivalents thereof.

What is claimed is:

1. A press pack power semiconductor device comprising:

a housing;

a semiconductor; and a locator strip deformed into a ring-like shape to concentrically fit within the housing and concentrically locate at least part of the semiconductor therein, wherein the locator strip includes a first plurality of regions regularly interspersed with a second plurality of regions along a length of the locator strip, and wherein each of the first plurality of regions has a first cross-sectional area that is smaller than a second cross-sectional area of each of the second plurality of regions, wherein each of the first plurality of regions includes a first trench on a first side of the locator strip, wherein each of the first plurality of regions includes a second trench on a second side of the locator strip, and wherein the second side of the locator strip is opposite the first side of the locator strip.

2. The press pack power semiconductor device of claim 1 wherein the second trench is directly opposite the first trench.

3. The press pack power semiconductor device of claim 1 wherein the second trench is offset from the first trench.

4. The press pack power semiconductor device of claim 1 wherein the first trench or the second trench is U-shaped.

5. The press pack power semiconductor device of claim 1 wherein the first trench or the second trench is V-shaped.

6. The press pack power semiconductor device of claim 1 wherein the first trench or the second trench is curved.

7. The press pack power semiconductor device of claim 1 wherein each of the first plurality of regions is weaker than each of the second plurality of regions.

8. A locator strip comprising:

a polymer sheet that includes a first plurality of regions regularly interspersed with a second plurality of regions along a length of the polymer sheet, wherein each of the first plurality of regions has a first cross-sectional area that is smaller than a second cross-sectional area of each of the second plurality of regions, and wherein the polymer sheet is deformable into a ring-like shape to concentrically fit within a housing of a press pack power semiconductor device and concentrically locate a semiconductor therein, wherein each of the first plurality of regions includes a first trench on a first side of the polymer sheet, wherein each of the first plurality of regions includes a second trench on a second side of the polymer sheet, and wherein the second side of the polymer sheet is opposite the first side of the polymer sheet.

9. The locator strip of claim 8 wherein the second trench is directly opposite the first trench.

10. The locator strip of claim 8 wherein the second trench is offset from the first trench.

11. The locator strip of claim 8 wherein the first trench or the second trench is U-shaped.

12. The locator strip of claim 8 wherein the first trench or the second trench is V-shaped.

13. The locator strip of claim 8 wherein the first trench or the second trench is curved.

14. The locator strip of claim 8 wherein each of the first plurality of regions is weaker than each of the second plurality of regions.

15. A method comprising:

weakening a first plurality of regions of a locator strip relative to a second plurality of regions of the locator strip with a first trench on a first side of the locator strip and a second trench on a second side of the locator strip;

deforming the locator strip into a ring-like shape;

concentrically fitting the ring-like shape of the locator strip within a housing; and concentrically locating a semiconductor within the ring-like shape of the locator strip, wherein the first plurality of regions are regularly interspersed with the second plurality of regions along a length of the locator strip, wherein each of the first plurality of regions has a first cross-sectional area that is smaller than a second cross-sectional area of each of the second plurality of regions, and wherein the second side of the locator strip is opposite the first side of the locator strip.

* * * * *